US007598566B2

(12) United States Patent
Hotta et al.

(10) Patent No.: US 7,598,566 B2
(45) Date of Patent: Oct. 6, 2009

(54) TRENCH GATE FIELD EFFECT DEVICES

(75) Inventors: Koji Hotta, Aichi-ken (JP); Sachiko Kawaji, Owariasahi (JP); Masanori Usui, Seto (JP); Takahide Sugiyama, Aichi-ken (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 283 days.

(21) Appl. No.: 10/579,228

(22) PCT Filed: Nov. 5, 2004

(86) PCT No.: PCT/JP2004/016792

§ 371 (c)(1),
(2), (4) Date: Nov. 7, 2006

(87) PCT Pub. No.: WO2005/048352

PCT Pub. Date: May 26, 2005

(65) Prior Publication Data
US 2007/0040213 A1 Feb. 22, 2007

(30) Foreign Application Priority Data
Nov. 12, 2003 (JP) .............................. 2003-382834

(51) Int. Cl.
*H01L 29/76* (2006.01)
*H01L 29/94* (2006.01)
(52) U.S. Cl. .................. 257/327; 257/329; 257/330; 257/E29.027; 257/E29.028; 438/133; 438/197
(58) Field of Classification Search ......... 257/327–331, 257/341, E29.027, E29.028, E29.066, E29.067; 438/133, 197
See application file for complete search history.

(56) References Cited

U.S. PATENT DOCUMENTS

| 5,894,149 | A | * | 4/1999 | Uenishi et al. .............. 257/331 |
| 6,060,747 | A | | 5/2000 | Okumura et al. |
| 6,354,825 | B1 | | 3/2002 | Fujiwara et al. |

FOREIGN PATENT DOCUMENTS

| JP | 08-316479 A | 11/1996 |
| JP | 09-260650 | 10/1997 |
| JP | 2000-058823 | 2/2000 |
| JP | 2000-058823 A | 2/2000 |

OTHER PUBLICATIONS

European Office Action dated Oct. 17, 2007.

* cited by examiner

*Primary Examiner*—Theresa T Doan
(74) *Attorney, Agent, or Firm*—Kenyon & Kenyon LLP

(57) ABSTRACT

The present invention provides a technique for accumulating minority carriers in the body region, that is, the intermediate region interposed between the top region and the deep region, and thus increasing the concentration of minority carriers in the intermediate region. A semiconductor device has a top region (34) of a second conductivity type, a deep region (26) of the second conductivity type, and an intermediate region (28) of a first conductivity type for isolating the top region and the deep region. The semiconductor device further has a trench gate (32) facing a portion of the intermediate region via an insulating layer (33). The portion facing the trench gate isolates the top region and the deep region. The trench gate extends along a longitudinal direction. The width of the trench gate is not uniform along the longitudinal direction; instead the width of the trench gate varies along the longitudinal direction.

11 Claims, 7 Drawing Sheets 36  34  33  32    36  34  33  32    36  34  33  32

36 34 33 32 34 36 34 33 32 34 36 34 33 32 34 36

TRENCH GATE FIELD EFFECT DEVICES

TECHNICAL FIELD

This is a 371 national phase application of PCT/JP2004/016792 filed 5 Nov. 2004, claiming priority to Japanese Patent Application No. JP 2003-382834 filed 12 Nov. 2003, the contents of which are incorporated herein by reference.

The present application claims priority to Japanese Patent Application 2003-382834 filed on Nov. 12, 2003, the contents of which are hereby incorporated by reference.

The present invention relates to a semiconductor device in which electronic current between a pair of electrodes is turned on and turned off by a trench type gate electrode (trench gate). More specifically, the semiconductor device of the invention comprises a top region of a second conductivity type, a deep region of the second conductivity type and an intermediate region of a first conductivity type for isolating the top region and the deep region. A trench gate is provided such that the trench gate faces a portion of the intermediate region via an insulating layer. The trench gate faces the portion of the intermediate region isolating the top region and the deep region. Electronic current between the top region and the deep region is turned on and off by the trench gate. The top region may be an emitter of IGBT or a source of MOS and the deep region may be a drift of IGBT or MOS. The present invention relates to a technology for decreasing voltage and resistance between the pair of the electrodes when a voltage for turning on the semiconductor device is being applied to the trench gate.

BACKGROUND ART

An IGBT (Insulated Gate Bipolar Transistor) is known in which a MOS structure is formed in a surface face portion of a bipolar transistor. FIG. 7 shows an example of an IGBT 6 in which trench gates 132 turn on and turn off a current flowing between a collector electrode C and an emitter electrode E.

The surface face portion of the IGBT 6 comprises an n$^+$ type emitter region 134 connected with the emitter electrode E, a p$^+$ type body contact region 136 connected with the emitter electrode E, and a p$^-$ type body region 128 that surrounds the body contact region 136 and the emitter region 134. Since the p$^+$ type body contact region 136 and the p$^-$ type body region 128 are maintained at the same potential, the two regions can be referred to together as the body region.

An n$^-$ type drift region 126 is formed below the p$^-$ type body region 128. An n$^+$ type buffer region 124 is formed below the drift region 126. A p$^+$ type collector region 122 is formed below the buffer region 124. The collector region 122 is connected with a collector electrode C.

Trenches that reach to the drift region 126 pass through the body region 128 that isolates the emitter region 134 from the drift region 126. Trench gates 132 are formed within these trenches. These trench gates 132 face, via a gate insulating layer 133, the body region 128 that isolates the emitter region 134 from the drift region 126.

The IGBT shown in FIG. 7 comprises a top region 134 of a second conductivity type, a deep region 126 of the second conductivity type and an intermediate region 128 of a first conductivity type for isolating the top region 134 and the deep region 126. Trench gates 132 are provided such that the trench gates 132 face, via an insulating layer 133, a portion of the intermediate region 128 isolating the top region 134 and the deep region 126.

The operation of the IGBT 6 in an on state will be described. When the emitter electrode E is earthed, positive voltage is applied to the collector electrode C, and positive voltage is applied to the trench gates 132. The portion facing the trench gates 132 via the gate insulating layer 133 in the body region 128 is then inverted to the n type. Thereupon, electron carriers are injected from the emitter region 134 towards the drift region 126 via channels that have been inverted to the n type, and accumulate in the buffer region 124. When the electron carriers accumulate in the buffer region 124, the contact potential difference of the buffer region 124 and the collector region 122 decreases, and hole carriers are injected from the collector region 122 to the buffer region 124, and are further injected to the drift region 126. By this means, conductivity modulation occurs of the buffer region 124 and the drift region 126, and resistance decreases. The hole carriers injected from the collector region 122 recombine with the electron carriers and disappear, or are discharged to the emitter electrode E via the body region 128 and the body contact region 136. By utilizing this conductivity modulation, the IGBT 6 realizes a low on-voltage.

In order to further reduce the on-voltage in this type of semiconductor device, a semiconductor device has been proposed in which the concentration of hole carriers between the collector and emitter electrons is increased.

In Japanese Laid-Open Patent Publication No. 1996(H8)-316479, a semiconductor device is set forth in which a region with a higher concentration of impurities than a drift region is formed at a p-n junction boundary between the drift region and a body region. In this semiconductor device, hole carriers readily accumulate in the drift region due to the potential barrier formed in a boundary face between the semiconductor region that has a high concentration of impurities and the drift region. The concentration of the hole carriers can thus be increased. The injection rate of the electron carriers also increases as the concentration of the hole carriers is increased. Consequently, the on-voltage of the semiconductor device (the voltage between the electrodes while a voltage for turning on the semiconductor device is applied to the trench gate) is decreased.

DISCLOSURE OF INVENTION

In order to further reduce the on-voltage of this type of semiconductor device, it is necessary to reduce the resistance of not just the drift region, but also of the body region. To do so, the concentration of minority carriers in the body region must be increased. The semiconductor device of Japanese Laid-Open Patent Publication No. 1996-316479 is able to increase the concentration of minority carriers in the drift region, but cannot accumulate minority carriers in the body region and thus increase the concentration of minority carriers.

The present invention provides a technique for accumulating minority carriers in the body region, that is, the intermediate region interposed between the top region and the deep region, and thus increasing the concentration of minority carriers in the intermediate region. The present invention aims to further reduce the on-voltage of a semiconductor device by increasing the concentration of minority carriers in the intermediate region.

A semiconductor device according to the invention comprises a top region of a second conductivity type, a deep region of the second conductivity type, and an intermediate region of a first conductivity type for isolating the top region and the deep region. The semiconductor device further comprises a trench gate facing a portion of the intermediate region via an insulating layer. The portion facing the trench gate isolates the top region and the deep region. The trench gate extends along a longitudinal direction. The width of the trench gate according to the invention is not uniform along the longitudinal direction; instead the width of the trench gate varies along the longitudinal direction.

The semiconductor device according to the invention may be MOSFET, IGBT, or p-n-p-n Thyristor. The top region may be a source of MOSFET or an emitter of IGBT or a cathode of p-n-p-n Thyristor. The deep region may be a drift of MOSFET, IGBT, p-n-p-n Thyristor.

The top region may be connected with a conducting layer projecting to a surface face of the semiconductor device, and present within a range that connects with the trench gate. The top region need not cover the surface face of the semiconductor device. The intermediate region may be formed from a region of a second conductivity type that has a high concentration of impurities or from a region of the second conductivity type that has a low concentration of impurities. It is advantageous for the intermediate region to be formed from a region that has a high concentration of impurities, since ohmic contact between the intermediate region and the electrodes is easily attained.

In the trench gates of the aforementioned semiconductor device, the width of the trenches varies along the longitudinal direction. If a plurality of trench gates extend in parallel, the width of the intermediate region interposed between adjacent trench gates varies along the longitudinal direction of the trench gates. The surface area of the intermediate region is reduced in narrower regions between adjacent trench gates. Reducing the surface area of the intermediate region means that resistance increases relative to the minority carriers discharged to the emitter electrode via the intermediate region. As a result, the minority carriers that should have been discharged to the emitter more readily remain in the intermediate region. Since the quantity of majority carriers injected also increases in response, the on-voltage of the semiconductor device decreases.

It is essential that the trench width of the trench gates varies along the longitudinal direction. If, for example, the trench gates were formed to be wide along their entire length, there is the problem that off withstand voltage (the withstand voltage when the semiconductor device is off) deteriorates. That is, if the trench gates were wide along their entire length, the area of the p-n junction boundary between the intermediate region and the deep region would be reduced. Consequently, when the semiconductor device has been turned off, there would be a reduction of the electric field that could be maintained by a depressed layer extending from the p-n junction boundary between the intermediate region and the deep region. As a result, the electric field would readily be concentrated in the insulating layer that encloses the trench gates. In particular, the phenomenon readily occurs that the electric field is concentrated in the insulating layer located at the boundaries with the base face and side faces of the trench gates, and the insulating layer at these locations is destroyed. It is consequently essential that the trench width of the trench gates varies along the longitudinal direction. In other words, it is essential that, viewed from the longitudinal direction, wider regions between adjacent trench gates are formed in places. By this means, the electric field that is readily concentrated in the insulating layer at the narrower regions between adjacent trench gates can be dispersed towards the wider regions between adjacent trench gates. Locating the wider regions between adjacent trench gates, so that the electric field is dispersed, means that destruction of the insulating layer can be prevented and a high withstand voltage can be maintained.

In the case where a plurality of trench gates extend in parallel, it may be preferred that the phases of variations in width of the trench gates along the longitudinal direction are in alignment. That is, it is preferred that if a trench gate is wide, the adjacent trench gate is also wide at that location, and that if a trench gate is narrow, the adjacent trench gate is also narrow at that location.

If the phases of variations in width of the trench gates along the longitudinal direction are in alignment, there are narrower spaces between the wide portions of adjacent trench gates, and there are wider spaces between the narrower portions of adjacent trench gates. The narrower spaces and wider spaces between adjacent trench gates are formed alternately in the longitudinal direction of the trench gates. By this means, it is possible for the minority carriers to accumulate in the intermediate region, and the on-voltage of the semiconductor device can be reduced. Further, since the spaces between adjacent trench gates are formed alternately to be wider, an electric field is not concentrated in the insulating layers that cover the trench gates, and the off withstand voltage does not decrease.

In the case where the wide portions and narrow portions of the trench gates form a pair, and this pair is repeated in the longitudinal direction of the trench gates, it is preferred that the total length of the wide portions of the trench gates is formed in the range of 30 to 80% of the overall length of the trench gates.

If the trench gates have a wide width along their overall length, an electric field is concentrated in the gate insulating layers that cover the trench gates, and the off withstand voltage decreases. By contrast, if the trench gates have a narrow width along their overall length, minority carriers cannot accumulate in the intermediate region, as with the conventional semiconductor device. By forming wide portions of the trench gates such that they are in sections and are mutually separated along the longitudinal direction of the trench gates, minority carriers can accumulate without the off withstand voltage decreasing.

By forming the total length of the wide portions of the trench gates in the range of 30 to 80% of the overall length of the trench gates in the aforementioned semiconductor device, an electric field is not concentrated in the insulating layers and the off withstand voltage does not decrease. Consequently, minority carriers can accumulate in the intermediate region and the on-voltage can be reduced.

It is preferred that the variations in width of the trench gates are repeated cyclically along the longitudinal direction of the trench gates.

If this is done, the narrower regions and wider regions between adjacent trench gates are formed cyclically in the longitudinal direction. This means that the wider regions between adjacent trench gates are equally spaced. Consequently, it is easy to disperse the electric field that readily concentrates in the insulating layers.

By carefully examining the results obtained when the width of the trench gates in the longitudinal direction was varied, the present inventors discovered that not only can on-voltage be reduced, but that when the semiconductor device has been turned on, the turn-on period can be shortened.

In particular, they discovered that the turn-on period can be shortened considerably if the intermediate region that comprises the narrower regions between adjacent trench gates is set to be so narrow in width that it is actually depressed completely when voltage for turning on the semiconductor device is not being applied to the trench gates.

The depressed layer extends from a junction boundary between the insulating layer covering the trench gates and the semiconductor region even when gate voltage is not being applied to the trench gates.

If the intermediate region between adjacent trench gates is made to be narrow in width, and the film thickness of the insulating layer that covers the trench gates is optimized, the depressed layer that extends from each insulating layer connects within the intermediate regions between adjacent trench gates, and the intermediate region is depressed completely.

If, in this state, voltage for turning on the semiconductor device is applied to the trench gates, the depressed regions cannot extend further in the intermediate regions between adjacent trench gates, and an inverted layer can consequently be formed immediately in the intermediate regions.

In the aforementioned semiconductor device, an inverted layer can be formed within an extremely short period in the intermediate region that comprises the narrower portions between adjacent trench gates. The turn-on period can be shortened, and high speed switching characteristics are realized.

If the intermediate region that is interposed between adjacent trench gates is depressed completely when on-voltage is not being applied to the trench gates, there is no need to isolate the top region and the deep region by means of the intermediate region. The deep region may make direct contact with the top region that has wide spaces between the trench gates. If the deep region is made to be so narrow that this deep region between the trench gates is depressed completely when voltage for turning on the semiconductor device is not being applied to the trench gates, the semiconductor device can be turned off.

In the present invention, the concentration of minority carriers in the intermediate region can be increased, and the on-voltage of the semiconductor device (the voltage between the electrodes while the semiconductor device is on) can be decreased.

BEST MODE FOR CARRYING OUT THE INVENTION

Figure 1:
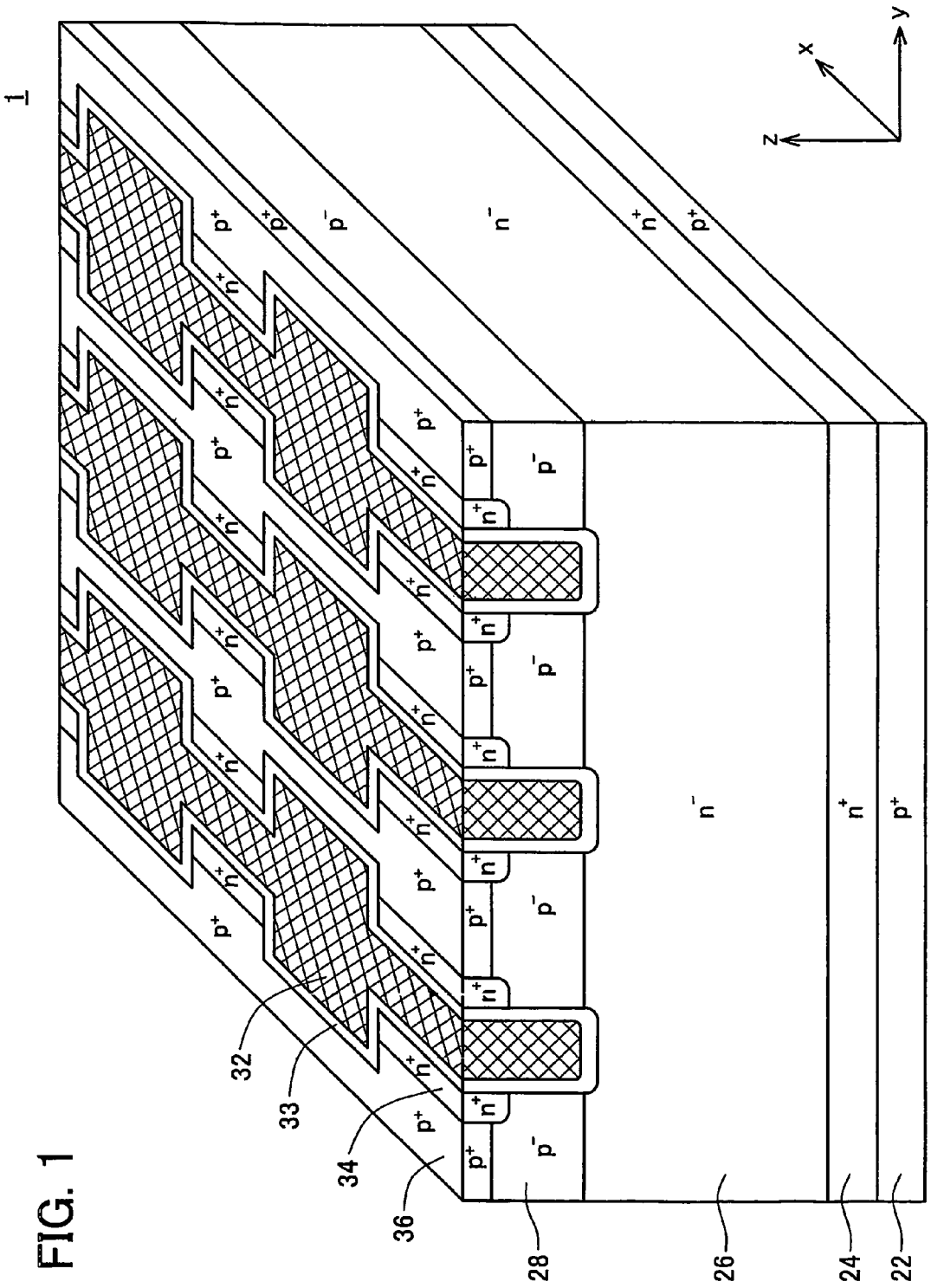
FIG. 1 shows a diagonal view of essential parts of a semiconductor device 1 of a first embodiment.

First, important characteristics of the embodiments will be listed.

(First characteristic) The width of trench gates of an IGBT varies along the longitudinal direction of the trench gates. This IGBT comprises: an emitter region of a second conductivity type (for example, n type) connected with an emitter electrode, a body contact region of a first conductivity type (for example, p type) connected with the same emitter electrode, a body region of the first conductivity type that surrounds the body contact region and the emitter region, a drift region of the second conductivity type that makes contact with the body region and is isolated by this body region from the body contact region and the emitter region, a buffer region of the second conductivity type that makes contact with the drift region and is isolated by this drift region from the body region, a collector region of the first conductivity type that makes contact with the buffer region and is isolated by this buffer region from the drift region, a collector electrode connected with the collector region, and a trench gate facing the body region via a gate insulating layer, this body region isolating the emitter region from the drift region.

The emitter region is the top region, the body region is the intermediate region, and the drift region is the deep region.

(Second characteristic) The width of trench gates of a MOSFET varies along the longitudinal direction of the trench gates.

This MOSFET comprises: a source region of a second conductivity type (for example, n type) connected with a source electrode, a body contact region of a first conductivity type (for example, p type) connected with the same source electrode, a body region of the first conductivity type that surrounds the body contact region and the source region, a drift region of the second conductivity type that makes contact with the body region and is isolated by this body region from the body contact region and the source region, a drain region of the second conductivity type that makes contact with the drift region and is isolated by this drift region from the body region, a drain electrode connected with the drain region, and a trench gate facing the body region via a gate insulating layer, this body region isolating the source region from the drift region.

The source region is the top region, the body region is the intermediate region, and the drift region is the deep region.

(Third characteristic) The phases of plane patterns of a plurality of trench gates that extend in parallel are in alignment along the longitudinal direction of the trench gates.

(Fourth characteristic) Portions of the trench gates that differ in width are formed with a constant cycle (are equally spaced) along the longitudinal direction of the trench gates.

(Fifth characteristic) Wider portions of the trench gates have a length in the longitudinal direction equal to or less than five times the space to an adjacent trench gate.

Embodiments will be described in detail below with reference to figures.

First Embodiment

FIG. 1 schematically shows a diagonal view of essential parts of a semiconductor device 1 of a first embodiment. The semiconductor device 1 is a semiconductor provided with a trench gate 32 for turning on and turning off electronic current flowing between a collector electrode and an emitter electrode.

The configuration of the semiconductor device 1 will be described, from its base face side, in the direction of the film thickness of the semiconductor device (the direction z in the figure). The semiconductor device 1 is provided with a collector region 22 of silicon monocrystal that contains $p^+$ type impurities. This collector region 22 connects with the collector electrode (not shown) consisting of aluminum or the like. A buffer region 24 of silicon monocrystal that contains $n^+$ type impurities is formed above the collector region 22. A drift region 26 of silicon monocrystal that contains n⁻ type impurities is formed above the buffer region 24. A body region 28 of silicon monocrystal that contains p⁺ type impurities is formed above the drift region 26.

A plurality of trench gates 32 that are formed in parallel (in the direction y in the figure) pass through the body region 28 and reach the drift region 26. Each trench gate 32 faces the body region 28 via a gate insulating layer 33. The gate insulating layers 33 are formed from silicon oxide, and the trench gates 32 are formed from polysilicon. The trench gates 32 are formed such that wide portions of the trench gates 32 are repeated at a constant cycle in the longitudinal direction of these trench gates 32 (the direction x in the figure). Alternatively, one could also say that the wide portions of the trench gates 32 are repeated at equal intervals.

The cyclic phases of the plane patterns of adjacent trench gates 32 are in alignment. Consequently, there are narrower spaces between the wide portions of adjacent trench gates 32, and there are wider spaces between the non-wide portions of adjacent trench gates 32. The narrower spaces and wider spaces between adjacent trench gates 32 are formed cyclically in the direction in which the trench gates 32 extend (the direction shown by x).

An emitter region 34 that contains n⁺ type impurities and a p⁺ type body contact region 36 are formed on the body region 28. The emitter region 34 makes contact with the trench gates 32 along the wider spaces between the adjacent trench gates 32. The body contact region 36 is formed along a top portion of the body region 28, this including the narrower spaces between the adjacent trench gates 32. The emitter region 34 and the body contact region 36 are connected with an emitter electrode (not shown). Since the body contact region 36 keeps the emitter electrode and the body region 28 the same potential, this body contact region 36 can be omitted if ohmic contact is maintained between the emitter electrode and the body region 28. Thus that which, in a narrow sense, is the body region 28 and the body contact region 36 can be generally referred to, in a broad sense, as the body region.

It is preferred that the concentration of impurities of each semiconductor region is as follows: the collector region 22 is in the range of $1\times10^{18}$ to $1\times10^{20}$ cm⁻³, the buffer region 24 is in the range of $1\times10^{16}$ to $1\times10^{18}$ cm⁻³, the drift region 26 is in the range of $1\times10^{13}$ to $1\times10^{14}$ cm⁻³, the body region 28 is in the range of $1\times10^{16}$ to $1\times10^{18}$ cm⁻³, the body contact region 36 is in the range of $1\times10^{18}$ to $1\times10^{20}$ cm⁻³, the emitter region 34 is in the range of $1\times10^{18}$ to $1\times10^{20}$ cm⁻³.

Figure 2:
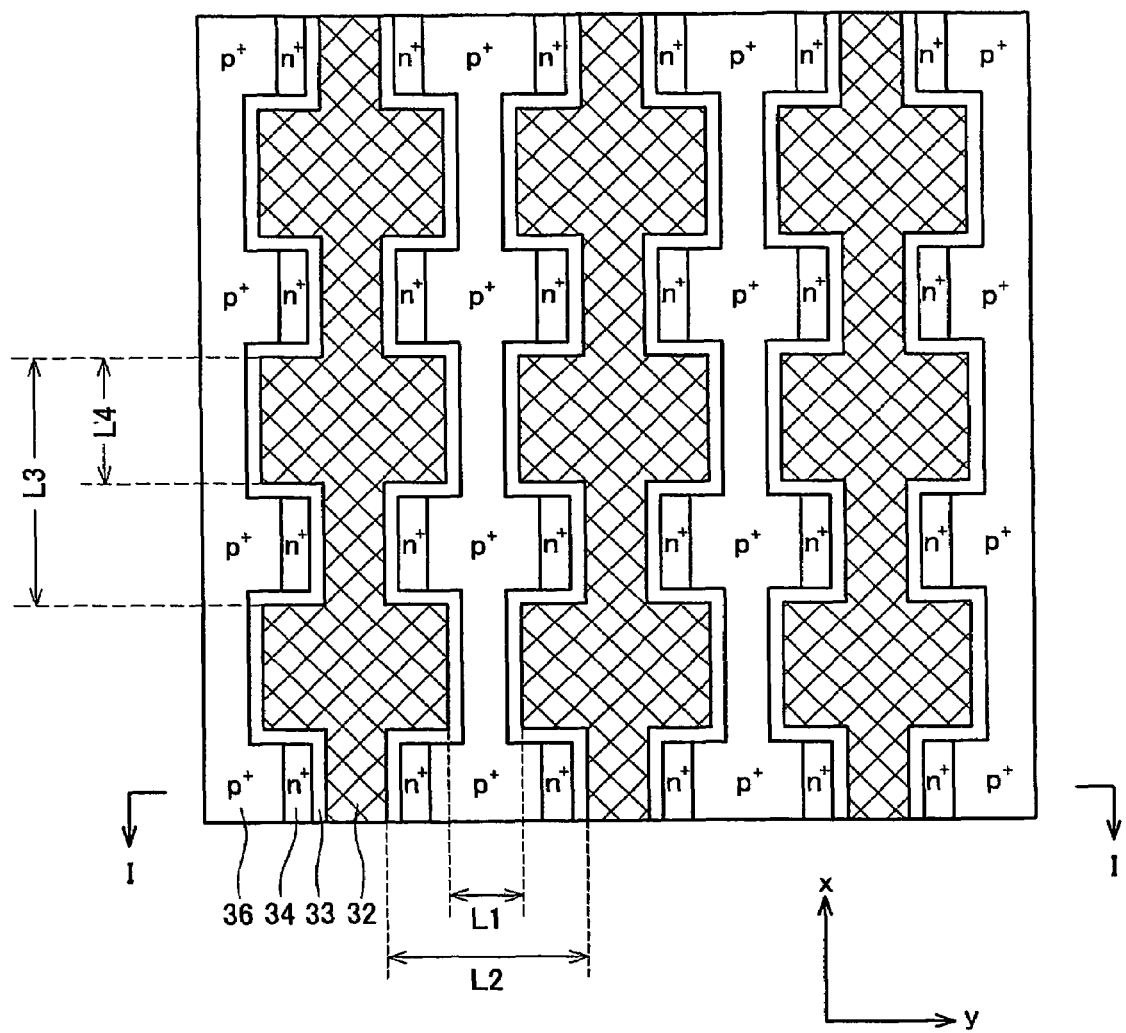
FIG. 2 shows a plane pattern of trench gates of the semiconductor device 1 of the first embodiment.

FIG. 2 shows a plan view of FIG. 1. The cross-sectional view along the line I-I of FIG. 2 corresponds to the front face of FIG. 1. Moreover, this plan view is a cross-sectional view of a face orthogonal to the direction extending between the collector and emitter electrodes.

The plurality of trench gates 32 are formed in parallel in the direction y in the figure. The wide portions (L4 in the figure) of the trench gates 32 are formed cyclically in the longitudinal direction of the trench gates 32 (the direction shown by x). The wide portions (L4 in the figure) of the trench gates 32 are formed in a particular ratio in each cycle (L3 in the figure) of the trench gates 32 (this including the non-wide portions of the trench gates 32). In other words, the wide portions of the trench gates 32 are formed in a particular ratio relative to the overall length of the trench gates 32. It is preferred that this ratio is in the range of 30 to 80%.

Further, narrower regions (L1 in the figure) are formed in the spaces between the wide portions (L4 in the figure) of adjacent trench gates 32. Similarly, wider regions (L2 in the figure) are formed in the spaces between the non-wide portions of adjacent trench gates 32. These narrower regions (L1) and wider regions (L2) between adjacent trench gates 32 extend along the cycle of the plane pattern of the trench gates 32, and are formed cyclically in the direction in which the trench gates 32 extend (the direction shown by x).

Since the surface area of the body contact region 36 comprises the narrower regions (L1) between adjacent trench gates 32, the body contact region 36 has a small surface area.

The semiconductor device 1 shown in FIGS. 1 and 2 comprises a top region 34 of a second conductivity type, a deep region 26 of the second conductivity type and an intermediate region 28 of a first conductivity type for isolating the top region 34 and the deep region 26. A plurality of trench gates 32 is provided such that the trench gates 32 face a portion of the intermediate region 28 isolating the top region 34 and the deep region 26 via an insulating layer 33.

In the above example, the first conductivity type is a p conductivity type, the second conductivity type is an n conductivity type. However, the first conductivity type may equally well be an n conductivity type, and the second conductivity type may equally well be a p conductivity type.

The operation of the semiconductor device in an on state will be described.

When the emitter electrode is earthed, positive voltage is applied to the collector electrode, and positive voltage is applied to the trench gates 32. Thereupon, the parts that are in the body region 28 and facing the trench gates 32 are inverted to the n type. By this means, electron carriers are injected from the emitter region 34, pass along the trench gates 32 along the parts that have been inverted to the n type, and are injected to the drift region 26. The electron carriers that have been injected into the drift region 26 flow towards a collector electrode side of this drift region 26, and are accumulated in the buffer region 24. When the electron carriers are accumulated in the buffer region 24, the contact potential difference of the buffer region 24 and the collector region 22 decreases, hole carriers are led from the collector region 22 to the buffer region 24, and are further injected to the drift region 26. By this means, conductivity modulation occurs in the buffer region 24 and the drift region 26, and a low on-voltage is realized.

The hole carriers injected from the collector region 22 to the drift region 26 recombine with the electron carriers and disappear, or are discharged to the emitter electrode via the body region 28 and the body contact region 36.

The body region 28 has a small surface area due to the regions (the regions corresponding to L1 in FIG. 2) interposed between the wide portions of the trench gates 32, and consequently diffusion resistance relative to the hole carriers is high. Furthermore, the body contact region 36, which comprises the regions (the regions corresponding to L1 in FIG. 2) interposed between the wide portions of the trench gates 32, has a small surface area. Consequently, this also has high contact resistance relative to the hole carriers. As a result, there is a high resistance value relative to the hole carriers that are discharged to the emitter electrode via the body contact region 36 (corresponding to the wide portions of the trench gates 32). Consequently, the concentration of the hole carriers in the body region 28 increases. Together with this, the electron carriers that are injected from the emitter region 34 are increased, and consequently the resistance of the body region 28 decreases. The on-voltage of the semiconductor device 1 decreases.

The surface area of the p-n junction boundary between the drift region 26 and the body region 28 (which is present in the regions (L1 in FIG. 2) interposed between the wide portions (L4 in FIG. 4) of the trench gates 32) is smaller than the wider regions (L2 in FIG. 2) between adjacent trench gates 32.

Consequently, an electric field readily concentrates at the gate oxide layers 33 (bent portions located at the base face and side face boundaries of the trench gates 32) of the wide portions of the trench gates 32. However, in the semiconductor device 1 of the present embodiment, the narrower regions (L1 in FIG. 2) and the wider regions (L2 in FIG. 2) are formed cyclically between adjacent trench gates 32 in the longitudinal direction of these trench gates 32 (the direction x in FIG. 2). As a result, an electric field that readily concentrates at the narrower regions (L1 in FIG. 2) between adjacent trench gates 32 can be dispersed towards the wider regions (L2 in FIG. 2) between adjacent trench gates 32. Destruction of the gate insulating layer 33 can thus be prevented. Moreover, so that the dispersal of the concentrated electric field is effective, it is preferred that the length in the longitudinal direction of the wide portions of the trench gates 32 (the length shown by L4 in FIG. 2) is five times or below the length of the spaces between the wide portions of adjacent trench gates 32 (the length shown by L1 in FIG. 2). If the wide portions of the trench gates 32 exceed this range, the electric field may be concentrated in the bent portions of the gate insulating layer 33 of the trench gates 32, and this gate insulating layer 33 destroyed.

Embodiments that can be assessed as transformations of the first embodiment will be described below with reference to figures. Configurations identical with those of the first embodiment have the same reference numbers assigned thereto and an explanation thereof is omitted.

Second Embodiment

Figure 3:
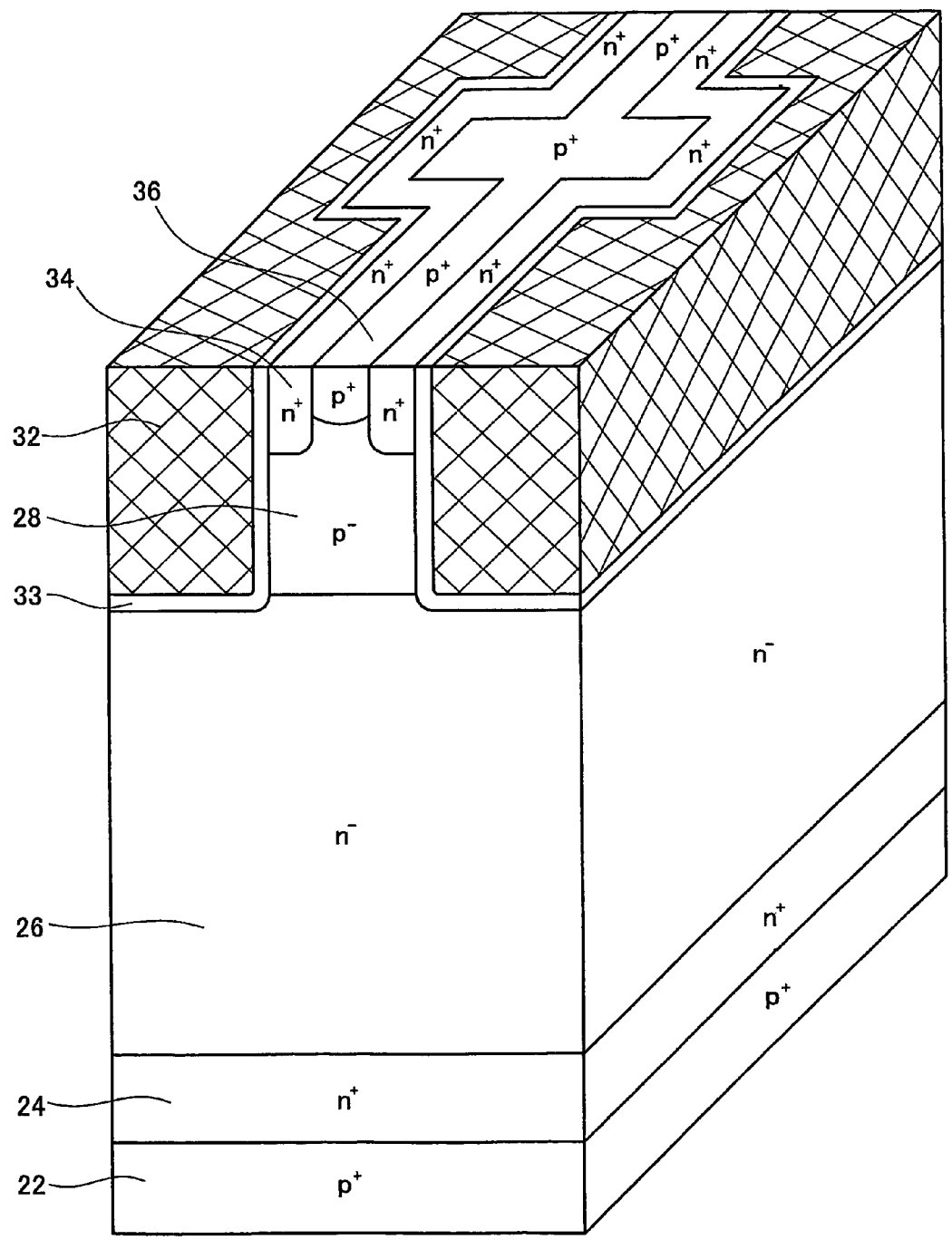
FIG. 3 shows a diagonal view of essential parts of a semiconductor device 2 of a second embodiment.

FIG. 3 schematically shows a diagonal view of essential parts of a semiconductor device 2. The configuration of the semiconductor device 2 differs from that of the semiconductor device 1 in the location at which the emitter region 34 is formed. The emitter region 34 is additionally formed on the body region 28 interposed between the wide portions of the adjacent trench gates 32.

In this case, the inverted layer that is formed in the body region 28 facing the wide portions of the adjacent trench gates 32 can effectively be used as channels for the electron carriers injected from the emitter region 34. Consequently, the channels become wider, and the on-voltage can therefore be reduced further.

Third Embodiment

Figure 4:
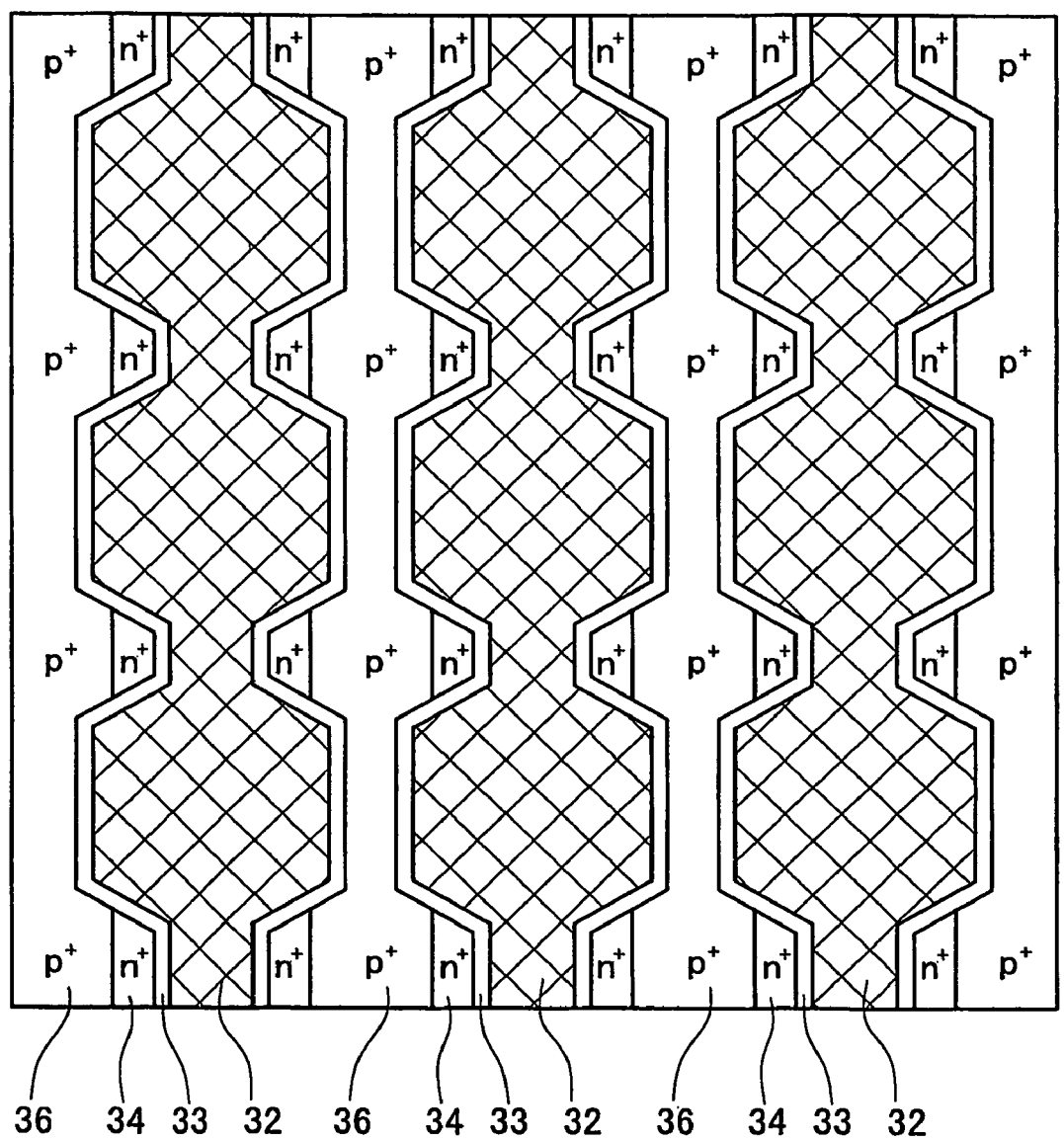
FIG. 4 shows a plane pattern of trenches gates of a semiconductor device 3 of a third embodiment.

FIG. 4 schematically shows essential parts of a plane pattern of the trench gates 32 of a semiconductor device 3.

The wide portions of the trench gates 32 need not be rectangular as in the semiconductor device 1 of the first embodiment, but can equally well be formed in a polygonal shape, as in the third embodiment. In the case of the third embodiment, these have been formed in substantially hexagonal shapes. In this case, as well, the same operation and effects as the semiconductor device 1 of the first embodiment means that there is higher diffusion resistance and contact resistance relative to the hole carriers in the regions interposed between the wide portions of the trench gates 32, and the on-voltage is reduced.

Fourth Embodiment

Figure 5:
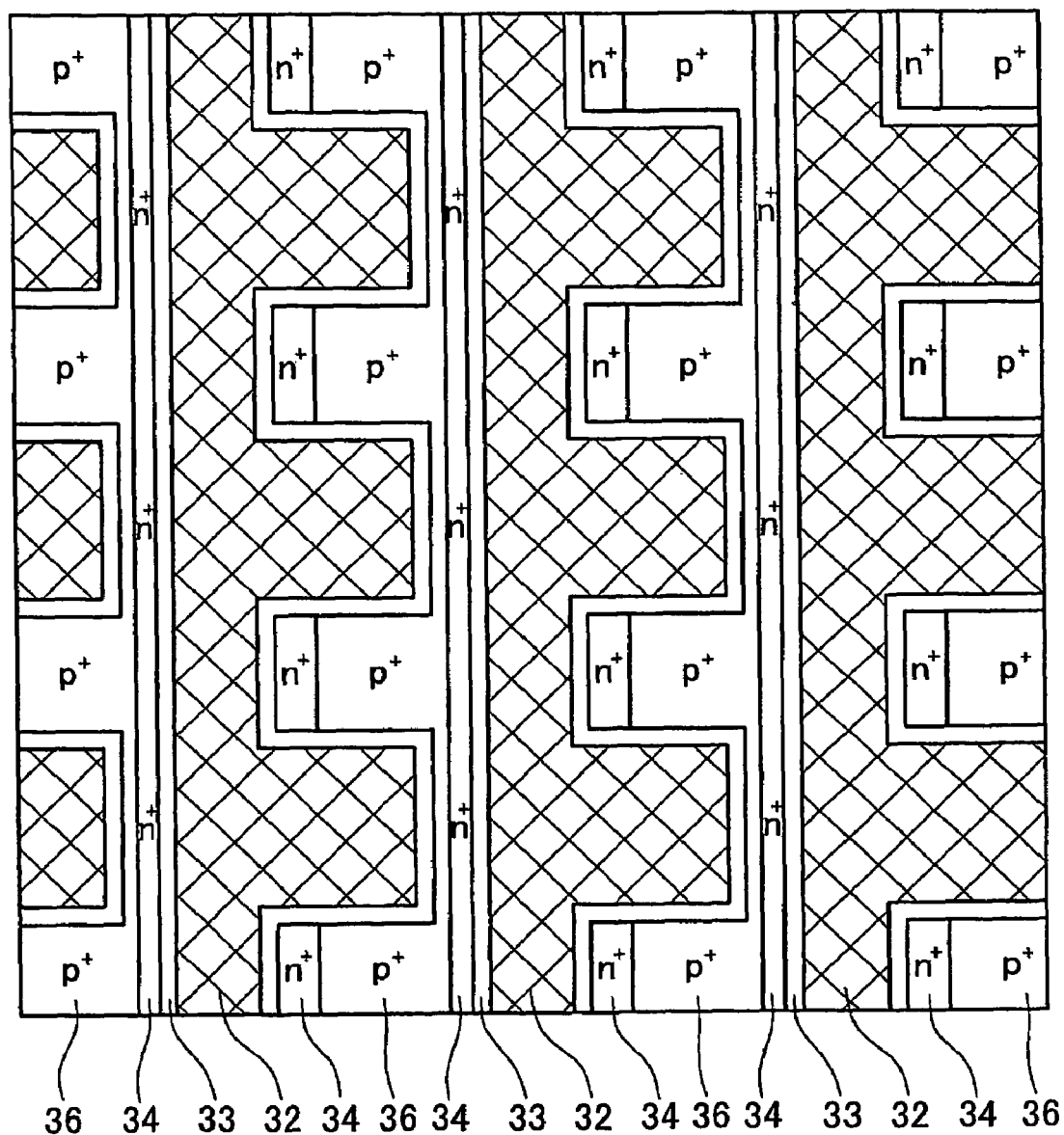
FIG. 5 shows a plane pattern of trench gates of a semiconductor device 4 of a fourth embodiment.

In a semiconductor device 4 shown in FIG. 5, the plane pattern of the adjacent trench gates 32 is not symmetrical.

In this case, as well, the space between adjacent trench gates 32 is made narrower by the wide portions of the trench gates 32. As a result, there is higher diffusion resistance and contact resistance relative to the hole carriers in these narrower spaces, and the on-voltage is reduced.

Fifth Embodiment

Figure 6:
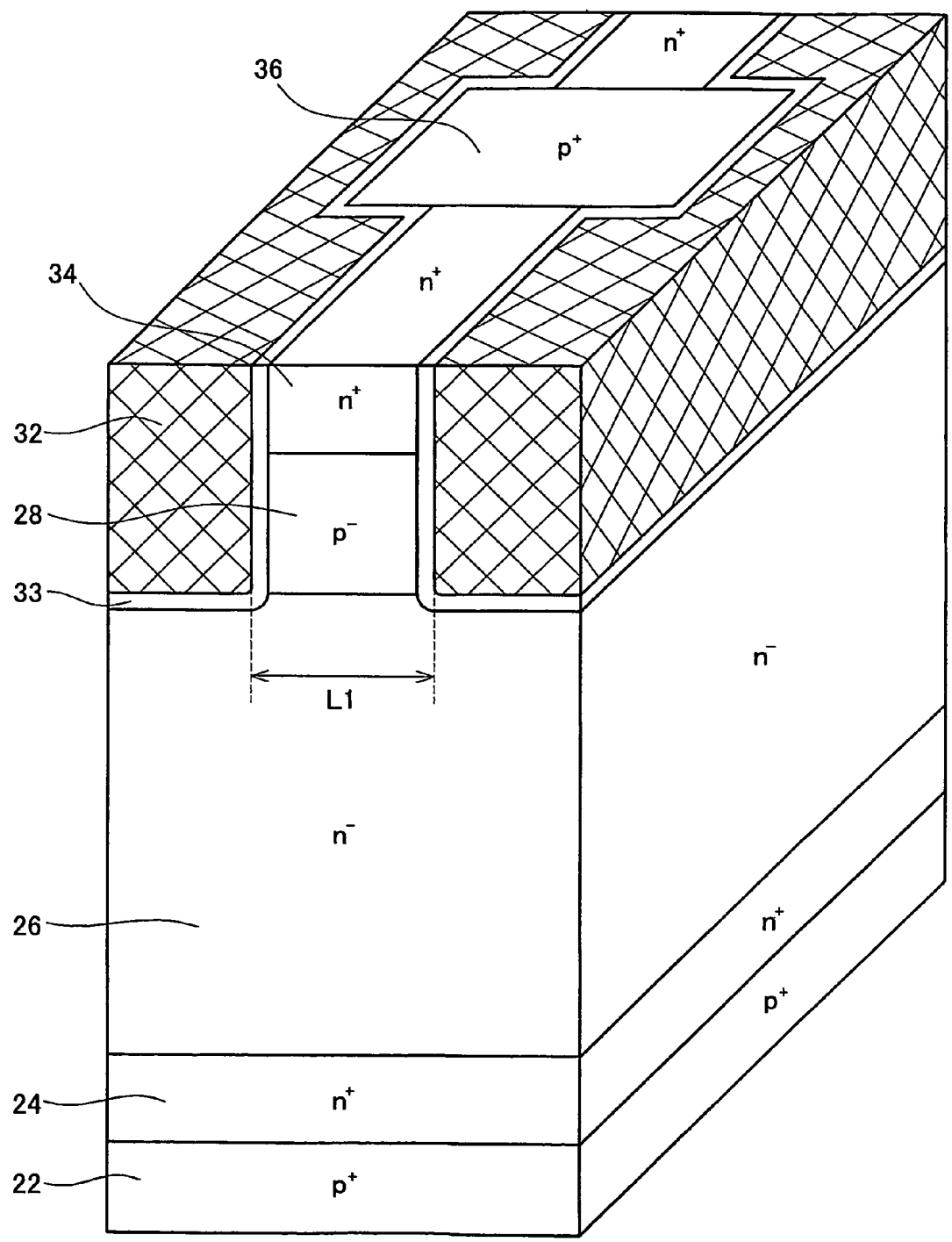
FIG. 6 shows a diagonal view of essential parts of a semiconductor device 5 of a fifth embodiment.
Figure 7:
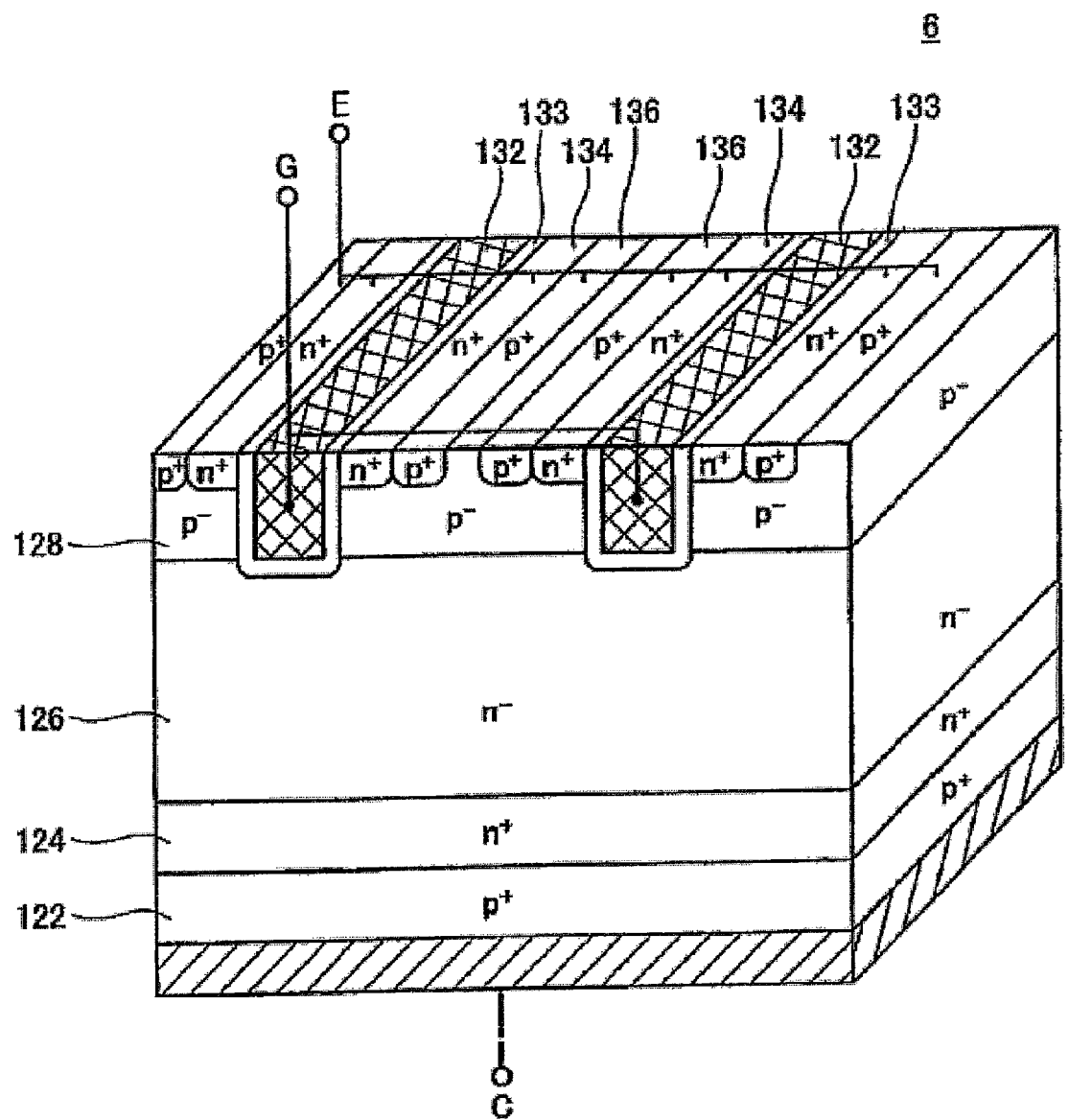
FIG. 7 shows a diagonal view of essential parts of a conventional semiconductor device.

FIG. 6 schematically shows a diagonal view of essential parts of a semiconductor device 5.

In the semiconductor device 5 of the fifth embodiment, the emitter region 34 is formed on the region made narrower by the wide portions of the trench gates 32. Further, in the present embodiment, the region made narrower by the wide portions of the trench gates 32 (L1 in the figure) is extremely narrow in width. This extremely narrow width means that the body region 28 formed below the emitter region 34 is actually depressed completely when gate voltage is not being applied to the trench gates 32. That is, when the region made narrower by the trench gates 32 is extremely narrow, a depressed region extending from the junction boundary between the gate insulating layer 33 and the body region 28 can connect with a depressed region extending from the facing trench gate 32. By this means, the body region 28 is depressed completely when gate voltage is not being applied to the trench gates 32. As a result, the depressed regions cannot extend further when gate voltage is applied to the trench gates 32, and are consequently inverted immediately. That is, the turn-on period of the semiconductor device is shortened.

In the semiconductor device shown in FIG. 6, the intermediate region 28 interposed between adjacent wide portions of the trench gates 32 is so narrow that the interposed region 28 becomes a depressed region when turn-on-voltage is not being applied to the trench gates 32.

The width (L1 in the figure) of the intermediate region 28 interposed between the wide portions of the trench gates 32, and the film thickness of the gate insulating layers 33 of the trench gates 32, may be adjusted as required so that the intermediate region 28 will be depressed completely.

Further, in the case where this region is depressed completely, the body region 28 need not be formed below the emitter region 34 since the conducting type of this region is not particularly problematic. The emitter region 34 may make direct contact with the drift region 26. Even if the emitter region 34 makes direct contact with the drift region 26, if the drift region 26 interposed between the wide portions of the trenches is depressed completely, the semiconductor device can be turned off.

Moreover, in the semiconductor device 5 of the fifth embodiment, as well, the surface area of the body contact region 36 is reduced, and consequently the contact resistance relative to the hole carriers is increased. Consequently, the concentration of the hole carriers in the body region 28 increases, and a decrease in on-voltage is realized.

The embodiments described above merely illustrate some possibilities of the invention and do not restrict the claims thereof. The art set forth in the claims encompasses various transformations and modifications to the embodiments described above.

Furthermore, the technical elements disclosed in the present specification or figures may be utilized separately or in all types of conjunctions and are not limited to the conjunctions set forth in the claims at the time of submission of the application. Furthermore, the art disclosed in the present specification or figures may be utilized to simultaneously realize a plurality of aims or to realize one of these aims.

The invention claimed is:

1. A semiconductor device of IGBT comprising:
a top region of a second conductivity type;
a deep region of the second conductivity type;

an intermediate region of a first conductivity type for isolating the top region and the deep region;
a collector region of the first conductivity type contacting with the deep region and being isolated from the intermediate region by the deep region;
an emitter electrode connected with the top region;
a collector electrode connected with the collector region; and
a trench gate facing a portion of the intermediate region via an insulating layer, wherein the portion of the intermediate region facing the trench gate isolates the top region and the deep region, and wherein the trench gate extends along a longitudinal direction in a plan view of the semiconductor device and width of the trench gate varies along the longitudinal direction in a plan view of the semiconductor device.

2. The semiconductor device according to claim 1,
wherein a plurality of trench gates extending in parallel is provided, and variations of width of trench gates along the longitudinal direction are aligned in phase between adjacent trench gates.

3. The semiconductor device according to claim 1,
wherein a side wall of the trench gate at a wider width is parallel with a side wall of an adjacent trench gate.

4. The semiconductor device according to claim 3,
wherein variations of width of each trench gate along the longitudinal direction are repeated cyclically along the longitudinal direction.

5. The semiconductor device according to claim 4,
wherein a pair comprising a wider width and a narrower width is repeated along the longitudinal direction in one trench gate, and total length of the wider width along the longitudinal direction is 30 to 80% of the total length of the trench gate along the longitudinal direction.

6. The semiconductor device according to claim 5,
wherein a plurality of trench gates extending in parallel is provided, and variations of width of trench gates along the longitudinal direction are aligned in phase between adjacent trench gates.

7. The semiconductor device according to claim 6,
wherein width of the intermediate region interposed between adjacent trench gates at wider width is narrow such that the intermediate region interposed between adjacent trench gates at wider width becomes a depressed region when on-voltage is not being applied to the trench gates, and the top region is located above the intermediate region interposed between adjacent trench gates at wider width.

8. The semiconductor device according to claim 1,
wherein variations of width of each trench gate along the longitudinal direction are repeated cyclically along the longitudinal direction.

9. The semiconductor device according to claim 8,
wherein a pair comprising a wider width and a narrower width is repeated along the longitudinal direction in one trench gate, and total length of the wider width along the longitudinal direction is 30 to 80% of the total length of the trench gate along the longitudinal direction.

10. The semiconductor device according to claim 1,
wherein width of the intermediate region interposed between adjacent trench gates at wider width is narrow such that the intermediate region interposed between adjacent trench gates at wider width becomes a depressed region when on-voltage is not being applied to the trench gates, and the top region is located above the intermediate region interposed between adjacent trench gates at wider width.

11. A semiconductor device of IGBT comprising:
a top region of a second conductivity type;
a deep region of the second conductivity type;
an intermediate region of a first conductivity type for isolating the top region and the deep region;
a collector region of the first conductivity type contacting with the deep region and being isolated from the intermediate region by the deep region;
an emitter electrode connected with the top region;
a collector electrode connected with the collector region; and
a trench gate extending through the top region and having a gate electrode, the trench gate further facing a portion of the intermediate region via an insulating layer, wherein the portion of the intermediate region facing the trench gate isolates the top region and the deep region, and wherein the trench gate further extends along a longitudinal direction in a plan view of the semiconductor device and width of the trench gate varies along the longitudinal direction in a plan view of the semiconductor device.

* * * * *

UNITED STATES PATENT AND TRADEMARK OFFICE
CERTIFICATE OF CORRECTION

PATENT NO. : 7,598,566 B2  Page 1 of 1
APPLICATION NO. : 10/579228
DATED : October 6, 2009
INVENTOR(S) : Hotta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 430 days.

Signed and Sealed this

Twenty-eighth Day of September, 2010

David J. Kappos
*Director of the United States Patent and Trademark Office*